US008057845B2

(12) United States Patent
Davis

(10) Patent No.: US 8,057,845 B2
(45) Date of Patent: Nov. 15, 2011

(54) METHOD FOR GLAZING A SASH

(75) Inventor: William B. Davis, Fombell, PA (US)

(73) Assignee: Sika Technology AG, Baar (CH)

( * ) Notice: Subject to any disclaimer, the term of this patent is extended or adjusted under 35 U.S.C. 154(b) by 465 days.

(21) Appl. No.: 12/419,009

(22) Filed: Apr. 6, 2009

(65) Prior Publication Data

US 2010/0255180 A1 Oct. 7, 2010

(51) Int. Cl.
*C23C 16/52* (2006.01)
*B05D 5/06* (2006.01)

(52) U.S. Cl. ............ 427/8; 118/668; 118/323; 427/165; 427/284; 427/287; 427/427.1; 427/427.3; 427/427.4

(58) Field of Classification Search .............. 427/8, 165, 427/284, 287, 286, 424, 427.1, 427.3, 427.4; 118/321, 323, 305, 668; 239/1, 455, 456; 222/1

See application file for complete search history.

(56) References Cited

U.S. PATENT DOCUMENTS

| | | | | |
|---|---|---|---|---|
| 4,208,849 | A * | 6/1980 | Lamb | 52/203 |
| 4,570,834 | A | 2/1986 | Ward | |
| 7,001,464 | B1 * | 2/2006 | Erdman et al. | 118/305 |
| 2005/0028459 | A1 | 2/2005 | Crandell et al. | |

FOREIGN PATENT DOCUMENTS

| | | |
|---|---|---|
| DE | 20307227 | 8/2003 |
| EP | 1529902 | 5/2005 |
| FR | 2745028 | 8/1997 |
| GB | 2352989 | 2/2001 |
| WO | WO-2005045157 | 5/2005 |

* cited by examiner

*Primary Examiner* — Mathieu D. Vargot
(74) *Attorney, Agent, or Firm* — Rader, Fishman & Grauer, PLLC

(57) ABSTRACT

A method of glazing a sash is disclosed. The method begins by placing a sash on a glazing table, wherein the sash defines an opening therein and has a glazing leg extending into the opening in the sash. At least two positioner assemblies are actuated, each positioner assembly having a position member defining a distal end. Each position member is selectively slidable between a stored position and an extended position. When the positioner assemblies are actuated, each position member is moved into the extended position such that the distal end of the positioner member contacts the glazing leg of the sash. A viewing element is then inserted into the sash opening and into abutting contact with portions of the positioner members so as to create a gap between an interior surface of the sash and an outer edge of the viewing element. Once the viewing element is positioned, the positioner members are retracted. Next, a back bedding glazing compound applicator assembly is actuated to move from a stored position to a dispensing position. The back bedding glazing compound applicator includes a nozzle head that is configured to fit within the gap between the interior surface of the sash and the outer edge of the viewing element when in the dispensing position. Once positioned, back bedding glazing compound is dispensed between the glazing leg and the viewing element. Once dispensing is complete, the back bedding glazing compound applicator assembly is retracted.

20 Claims, 15 Drawing Sheets

METHOD FOR GLAZING A SASH

BACKGROUND

In the manufacture and assembly of windows and doors that include a viewing or vision area; a viewing area layer (typically constructed of glass) must be assembled to a sash and fixedly secured thereto. More specifically, a traditional window and door manufacturing technique requires a number of steps. First, the sash, window frame or door glass assembly must be constructed. FIG. 1 illustrates an embodiment of a window sash 20. The window sash includes a sash opening 26 and a glazing leg 22 (best seen in FIGS. 6 and 7) to which a viewing area or glass layer 24 is ultimately secured. The glazing leg 22 extends inwardly from an inner surface of the window sash 20, along a perimeter of sash opening 26. Once the sash assembly is constructed, a suitable back bedding glazing compound is applied to the glazing leg 22. Next, the viewing area or glass 24 is laid into sash 20, and into contact with the back bedding glazing compound. A typical back bedding glazing compound used in this process has an open time that begins upon application, before the glass is laid, and can range from minutes to hours.

The length of cure time for the back bedding glazing compound cure time in prior art systems is necessary due to the steps involved in applying the back bedding glazing compound and properly laying and positioning the glass into the sash. More specifically, the glass laying process is a multi-step process.

After the back bedding glazing compound is applied to the glazing leg, setting blocks may be installed along the perimeter of the sash opening 26 so as to assist with centering, or squaring the glass layer 24 in the sash opening 26. After the setting blocks are positioned, the glass layer 24 is placed in contact with the back bedding glazing compound along the glazing leg, compressing the back bedding glazing compound to effect a strong seal between the glass layer an the glazing leg. In some instances, it may be necessary to maneuver the glass layer to properly center or square the glass layer in the sash. Alternatively, after the back bedding glazing compound is applied to the glazing leg, the glass is laid and centered in the sash opening and setting blocks are inserted around the glass perimeter. Accordingly, a sufficient cure time for the back bedding glazing compound has been required to provide for such maneuverability.

Once the glass layer 24 is properly positioned, glazing beads (or glazing stops) may be installed such that they conceal a gap created by the setting blocks to maintain position of the glass while the back bedding glazing compound cures to fix the glass layer 24 to the glazing leg 22. However, because of the cure time needed to accommodate proper positioning of the glass layer on the back bedding glazing compound, once the glass layer 24 is positioned with the spacers, the assembly must then be moved to a curing station to complete the cure operation. As such, the current method results in significant delay in completing manufacturing of windows and doors. In addition, due to the extra manufacturing steps of loading and unloading the assembly onto drying pallets, significant expense is incurred.

Accordingly, there exists a need to decouple the back bedding glazing compound open time limitations from the glass laying process. Decoupling will allow for the use of back bedding glazing compounds with faster cure times, thereby allowing increased through put while reducing, eliminating staging and racking time of glazed sashes.

SUMMARY

A method of glazing a sash is disclosed. The method begins by placing a sash on a glazing table, wherein the sash defines an opening therein and has a glazing leg extending into the opening in the sash. At least two positioner assemblies are actuated, each positioner assembly having a position member defining a distal end. Each position member is selectively slidable between a stored position and an extended position. When the positioner assemblies are actuated, each position member is moved into the extended position such that the distal end of the positioner member contacts the glazing leg of the sash. A viewing element is then inserted into the sash opening and into abutting contact with portions of the positioner members so as to create a gap between an interior surface of the sash and an outer edge of the viewing element. Once the viewing element is positioned, the positioner members are retracted. Next, a back bedding glazing compound applicator assembly is actuated to move from a stored position to a dispensing position. The back bedding glazing compound applicator includes a nozzle head that is configured to fit within the gap between the interior surface of the sash and the outer edge of the viewing element when in the dispensing position. Once positioned, back bedding glazing compound is dispensed between the glazing leg and the viewing element. Once dispensing is complete, the back bedding glazing compound applicator assembly is retracted.

BRIEF DESCRIPTION OF THE DRAWINGS

Referring now to the drawings, illustrative embodiments are shown in detail. Although the drawings represent some embodiments, the drawings are not necessarily to scale and certain features may be exaggerated, removed, or partially sectioned to better illustrate and explain the present invention. Further, the embodiments set forth herein are exemplary and are not intended to be exhaustive or otherwise limit or restrict the claims to the precise forms and configurations shown in the drawings and disclosed in the following detailed description.

DETAILED DESCRIPTION

Figure 1:
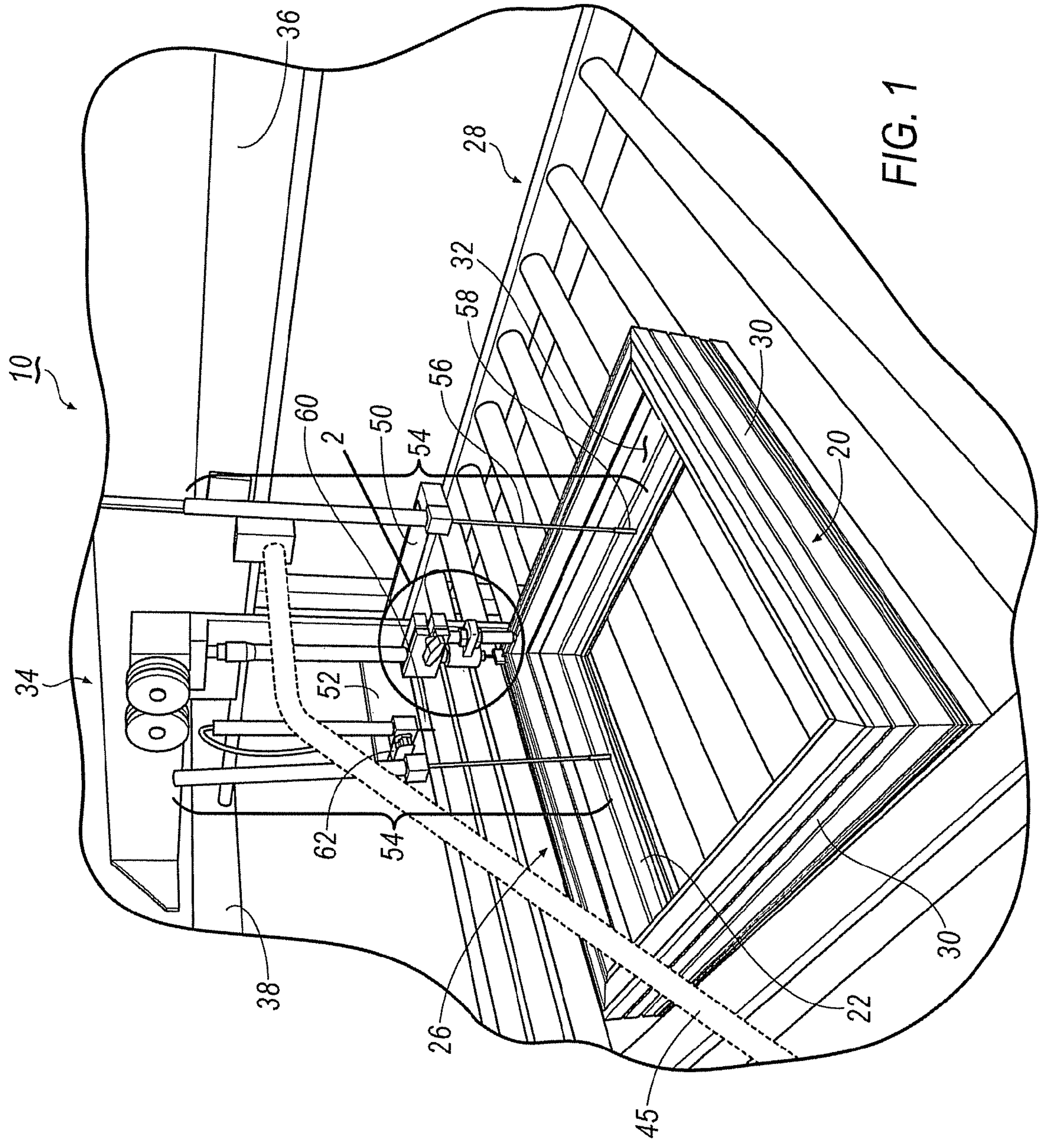
FIG. 1 is a perspective view of a sealing assembly, illustrating a positioning step in a method of assembling a viewing area to a sash.

Various components of a glazing assembly 10 will first be explained. Referring to FIG. 1, an exemplary sash 20 is shown on a glazing table 28. While the present disclosure depicts sash 20 as a window, it is understood that the disclosure is not limited to windows.

Figure 6:
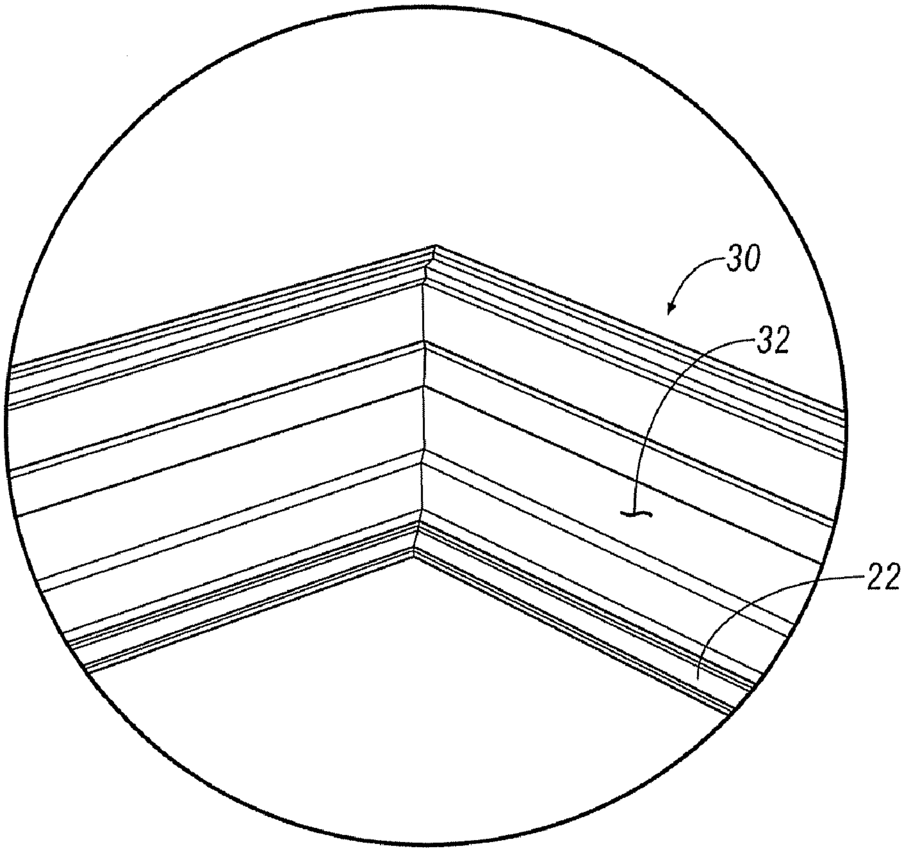
FIG. 6 is an enlarged view of a portion of the sash depicted in encircled area 6 of FIG. 4.

Sash 20 typically includes an outer periphery defined by upwardly raised wall members 30 that defines a sash opening 26. The interior surface 32 of wall members 30 are each configured to have an inwardly extending glazing leg 22 (best seen in FIG. 6) that forms a ledge extending around interior surface 32 of wall members 23. Glazing leg 22 will be discussed in further detail below.

Positioned above glazing table 28 is a back bedding glazing compound distribution system 34 that is fluidly connected to a back bedding glazing compound supply source (not shown). Back bedding glazing compound distribution system 34 is mounted to as to be selectively moveable along cross rails 36, 38 that are positioned perpendicular to each other.

Figure 2:
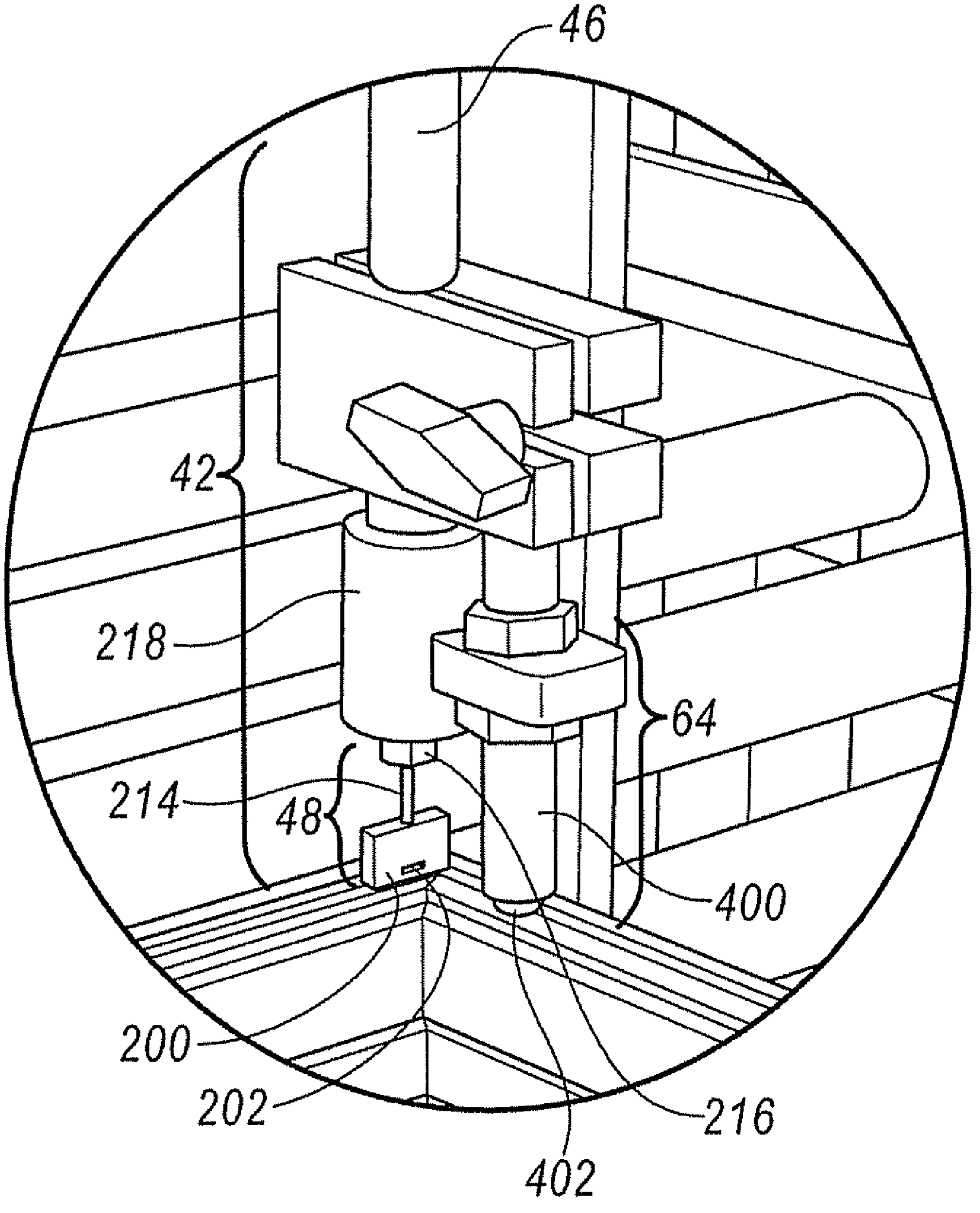
FIG. 2 is an enlarged view of an exemplary arrangement of a back bedding glazing compound applicator assembly depicted in encircled area 2 of FIG. 1.

Back bedding glazing compound distribution system 34 includes a back bedding glazing compound applicator assembly 42, best seen in FIG. 2. Back bedding glazing compound applicator assembly 42 includes a static mixer 44 (best seen in FIGS. 19 and 20) that is mounted in a sleeve 46 and an applicator nozzle assembly 48 (best seen in FIG. 19).

Extending from back bedding glazing compound distribution system 34 are first and second support brackets 50, 52. In one embodiment, first and second support brackets 50, 52 are positioned so as to extend generally perpendicular to each other. First and second support brackets 50, 52 are also arranged so as to be in a fixed position relative to back bedding glazing compound applicator assembly 42. Exemplary embodiments of first and second support brackets 50, 52 are shown in FIGS. 13-16. An optional stabilizer assembly 53 may also be connected to back bedding glazing compound distribution system 34. Stabilizer assembly 53 will be discussed in further detail below.

Figure 24:
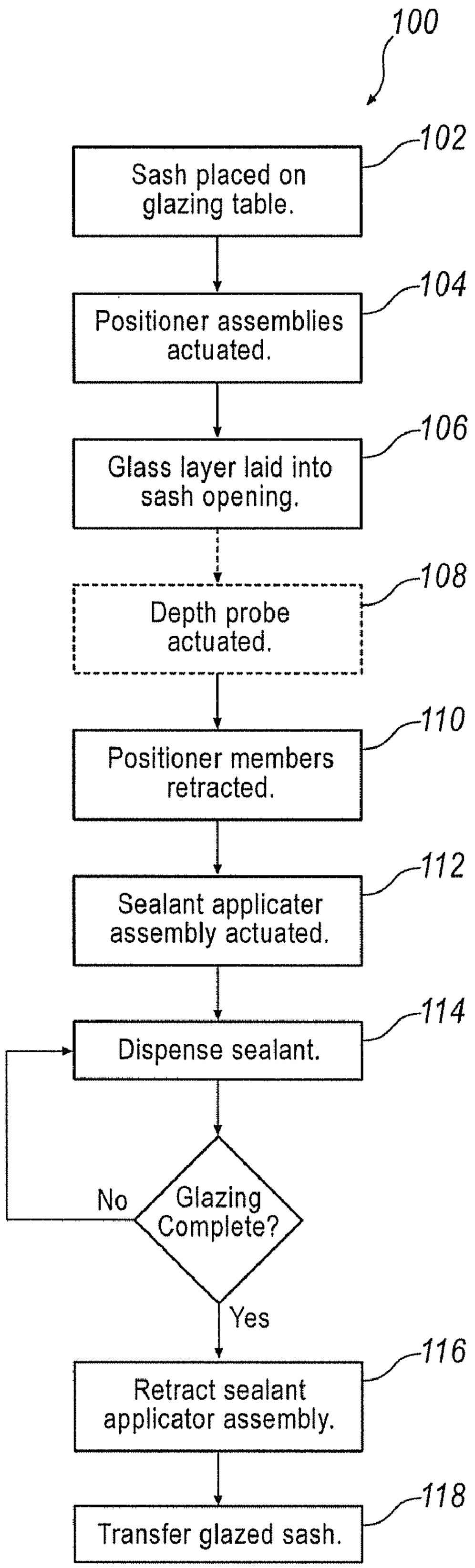
FIG. 24 is a flow chart illustrating the glazing process.

Fixed to each of first and second support brackets 50, 52 are positioner assemblies 54. An embodiment of positioner assembly 54 is shown in greater detail in FIG. 24. Each positioner assembly 54 includes a selectively actuatable position member 56 with a tip element 58 on a distal end thereof. A retaining member is attached to a proximal end of the position member 56 and serves to limit the distance that position member 56 may extend. Retaining member is positioned within a generally hollow housing 61 of the positioner assemblies 54. In one exemplary embodiment, tip element 58 is shown as having a generally cylindrical shape. However, it is understood that the tip element 58 may be constructed with other configurations, such as a wedge shape, for example, without departing from the disclosure. In one exemplary embodiment, tip element 58 is constructed of a non-abrasive material, such as, for example, Delrin® plastic, such that tip element 58 will not damage either sash 20 or glass layer 24 when contacting same. Position members 56 will be explained in further detail below.

One of first and second brackets 50, 52 may further include a selectively extendable depth probe 60 and position indicator 62. While depth probe 60 and position indicator 62 are both shown mounted on second bracket 52, it is understood that depth probe 60 and position indicator 62 may also be mounted on first bracket 50, or one may be positioned on first bracket 50 and the other may be positioned on second bracket 52.

Operation of glazing assembly 10 will now be described with reference to FIGS. 1-5 and 25. FIG. 25 is a flow chart illustrating the glazing operation 100. To begin the glazing operation, at step 102 sash 20 is placed on glazing table 28, which in one embodiment, is configured to have a generally horizontal mounting surface. Vertical mounting surfaces are also possible. Sash 20 is selectively fixed to glazing table 28 such that sash 20 is prevented from moving during the glazing operation. In one exemplary embodiment, glazing table 28 is provided with selectively actuated retaining walls (not shown) that engage an exterior surface of opposite walls 30. The process then proceeds to step 104.

At step 104, referring to FIG. 1, once sash 20 is properly positioned, positioner assemblies 54 are actuated such that position members 56 are lowered from a stored position to an extended position, into sash opening 26 until tip element 58 engages glazing leg 22. In one embodiment, positioner assemblies 54 include pneumatically actuated pistons 59 that are positioned within a positioner housing 61 that move position members 56 into the extended position. In addition to contacting glazing leg 22, a portion of tip element 58 also contacts interior surface 32 of sash opening 26. More specifically, in one exemplary embodiment, tip elements 58 are positioned adjacent to interior surface 32 of sash opening 26 that is generally orthogonal to glazing leg 22. The process then proceeds to step 106.

Figure 3:
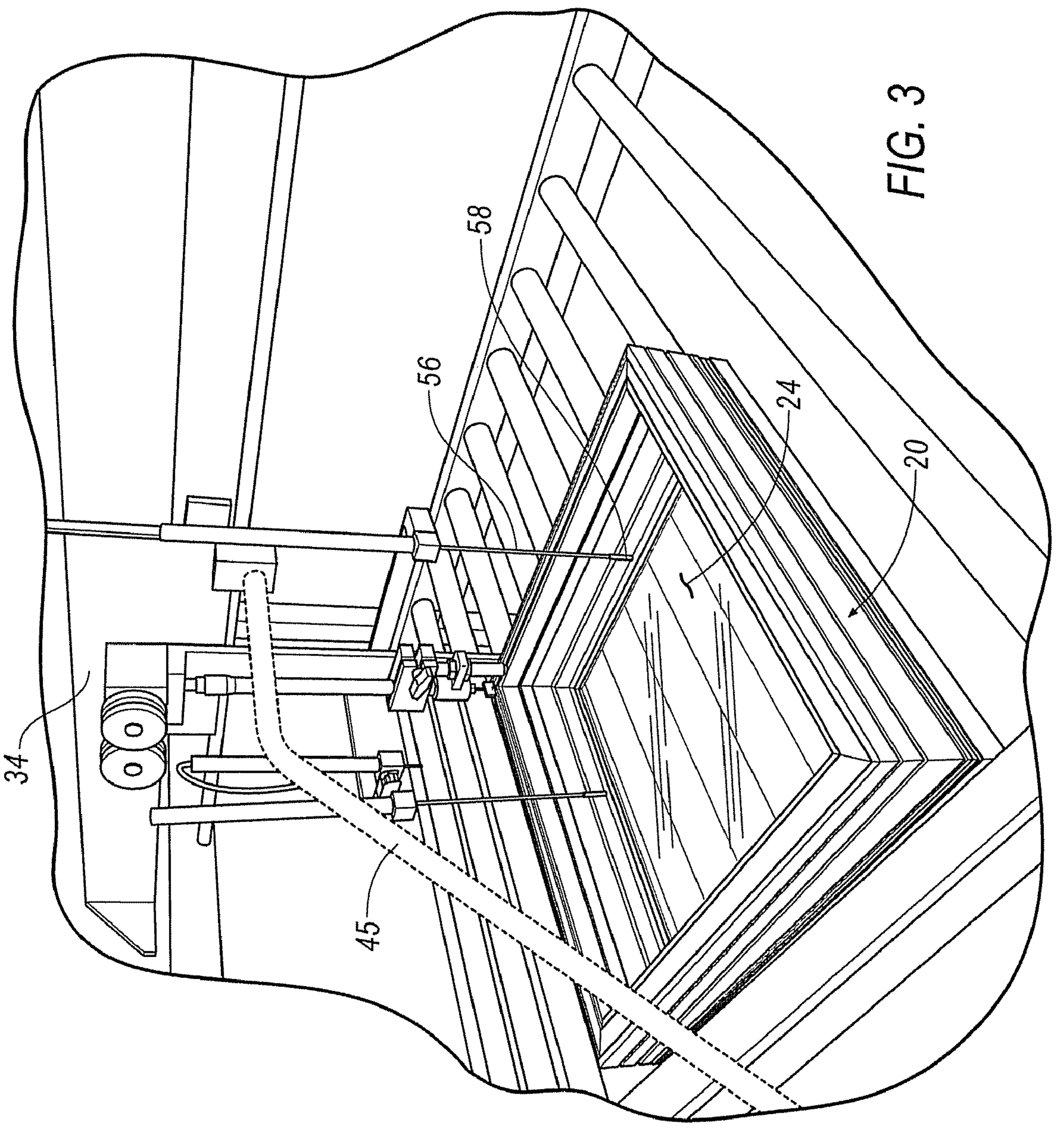
FIG. 3 is a perspective view of a glass insertion step in a method of assembling a viewing area to a sash.

At step 106, referring to FIG. 3, with positioner members 56 still in the extended position, and before any back bedding glazing compound is applied to sash 20, glass layer 24 is inserted into sash opening 26. Glass layer 24 is then pushed against each of tip elements 58 with a wedge (not shown) that is pushed against one of the edges of glass layer 24 that is not contacting tip element 58 to quickly fix glass layer 24 in position within sash opening 26. However, due to tip elements 58, a gap 66 is created between an outside edge 68 of glass layer 24 an interior surface 32 of sash 20. Further, tip elements 58 also serve to center glass layer 24 in sash opening 26. The process then proceeds to step 108.

Figure 4:
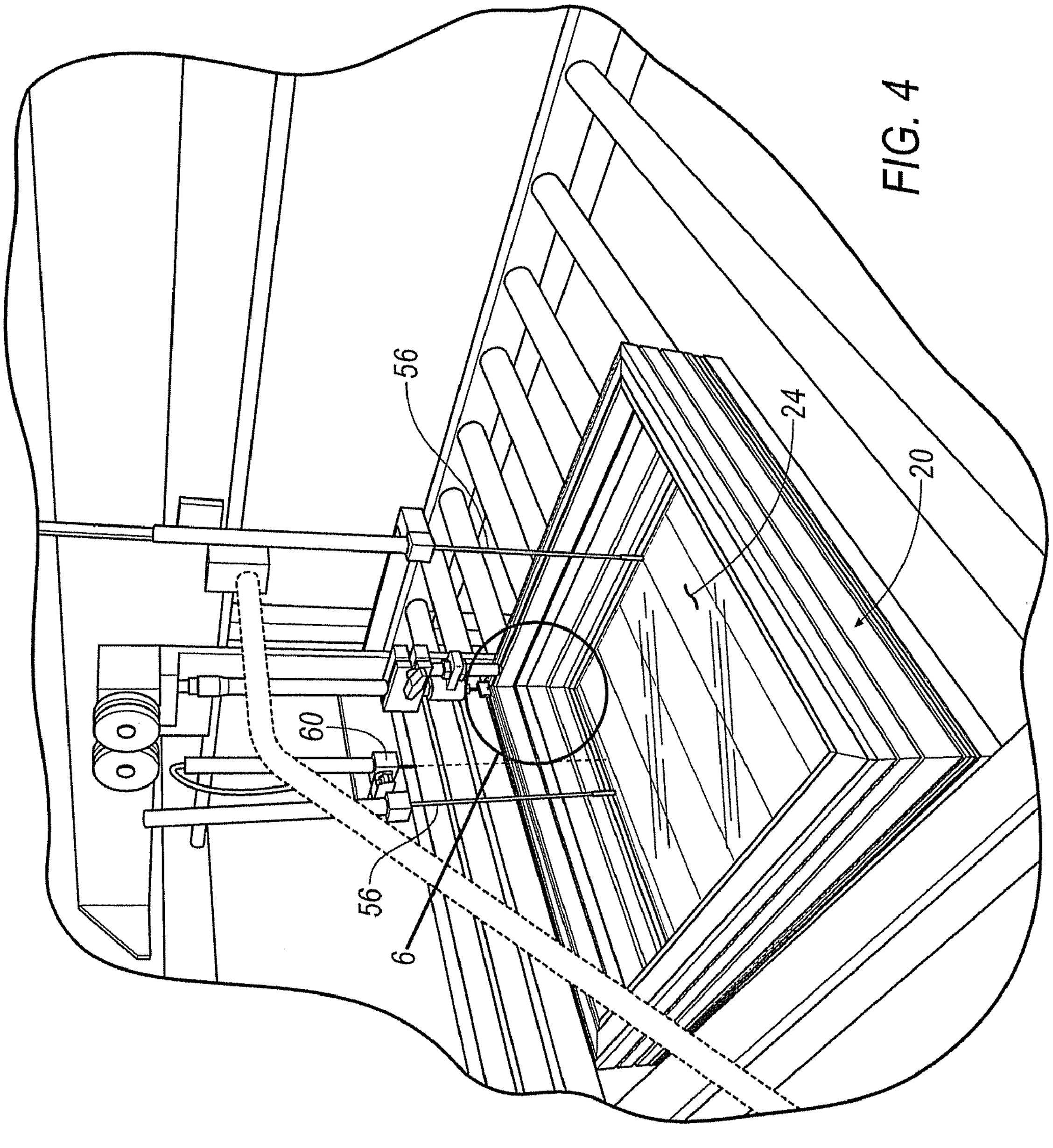
FIG. 4 is a perspective view of a depth verification step in a method of assembling a viewing area to a sash.
Figure 5:
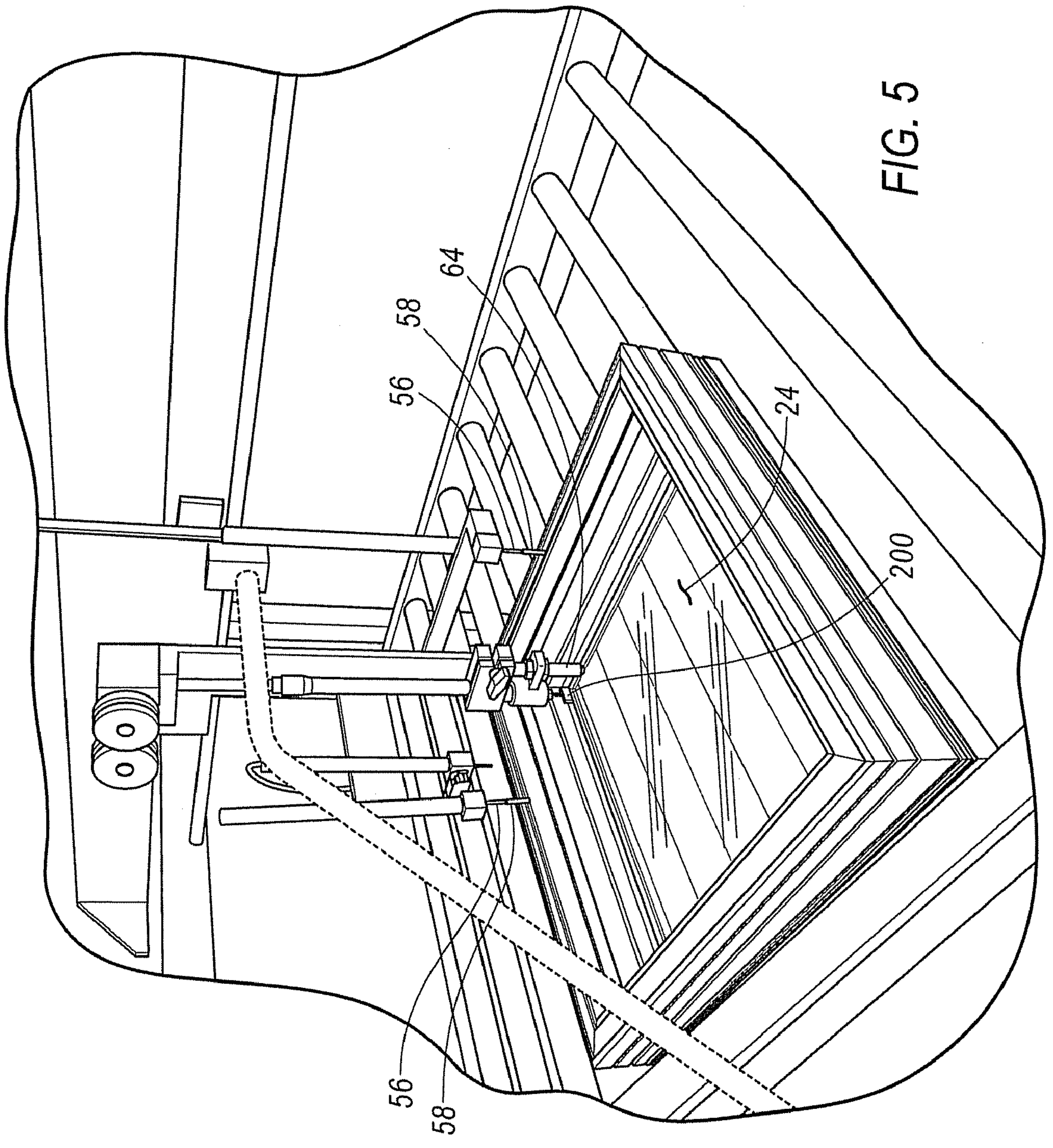
FIG. 5 is perspective view of a back bedding glazing compound application step in a method of assembling a viewing area to a sash.

At step 108, referring to FIG. 4, an optional depth probe 60 may be actuated to verify the depth of gap 66. During this operation, depth probe 60 is extended downward into gap 66 (shown in phantom) until a distal end of depth probe 60 contacts glazing leg 22. Depth probe 60 is configured with a sensor element to transmit the depth readings to a processing unit that is also in communication with back bedding glazing compound distribution system 34. Once the depth of gap 66 is verified, depth probe 60 is retracted into a stored position. The process then proceeds to step 110.

At step 110 (referring to FIG. 5), the positioner members 56 are retracted into the stored position. Next, at step 112 back bedding glazing compound applicator assembly 42 is lowered from a stored position (shown in FIG. 1) to a dispensing position (shown in FIG. 5). In the dispensing position, a nozzle head 200 of applicator nozzle assembly 48 is positioned within gap 66 (seen best in FIG. 7).

Applicator assembly 42 is lowered into the dispensing position either manually or automatically by a central control processor. In the manual operation, a hand grip 45 is provided (shown in phantom in FIG. 1) that moves applicator assembly 42 vertically, as well as laterally. To insure that applicator assembly 42, and particularly nozzle head 200 is properly positioned within gap 66, a position indicator 62 is mounted on one of first and second brackets 50, 52, so as to provide an indication to the user of the placement of nozzle head 200. In one particular embodiment, position indicator 62 is a laser light.

Figure 10:
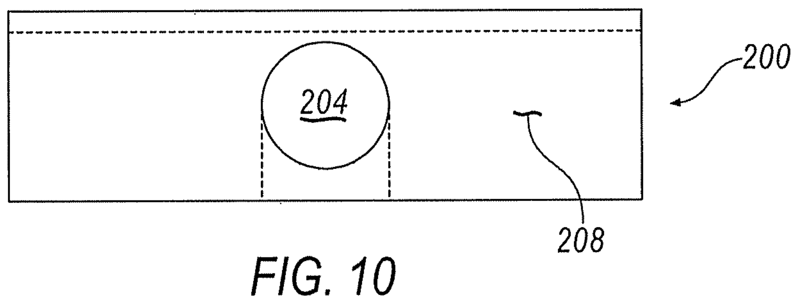
FIG. 10 is a top plan view of an exemplary embodiment of an applicator nozzle.
Figure 11:
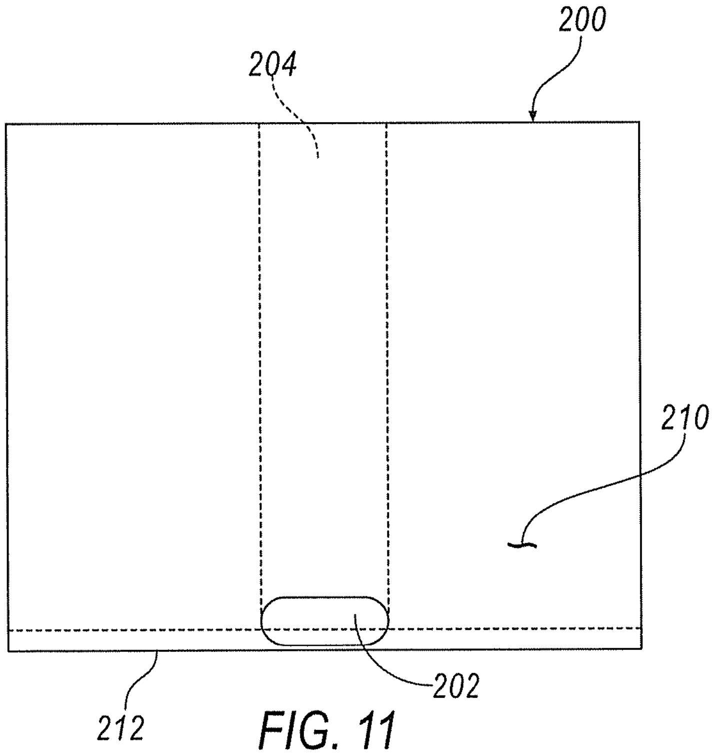
FIG. 11 is front elevational view of the applicator nozzle of FIG. 10.
Figure 12:
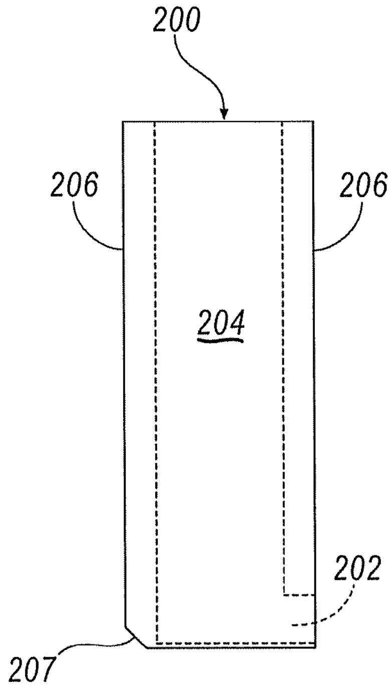
FIG. 12 is a side elevational view of the applicator nozzle of FIGS. 10-11.
Figure 13:
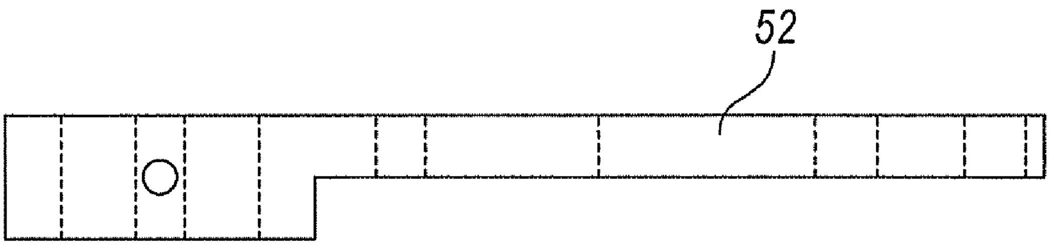
FIG. 13 is a top view of an exemplary embodiment of a first bracket.
Figure 14:
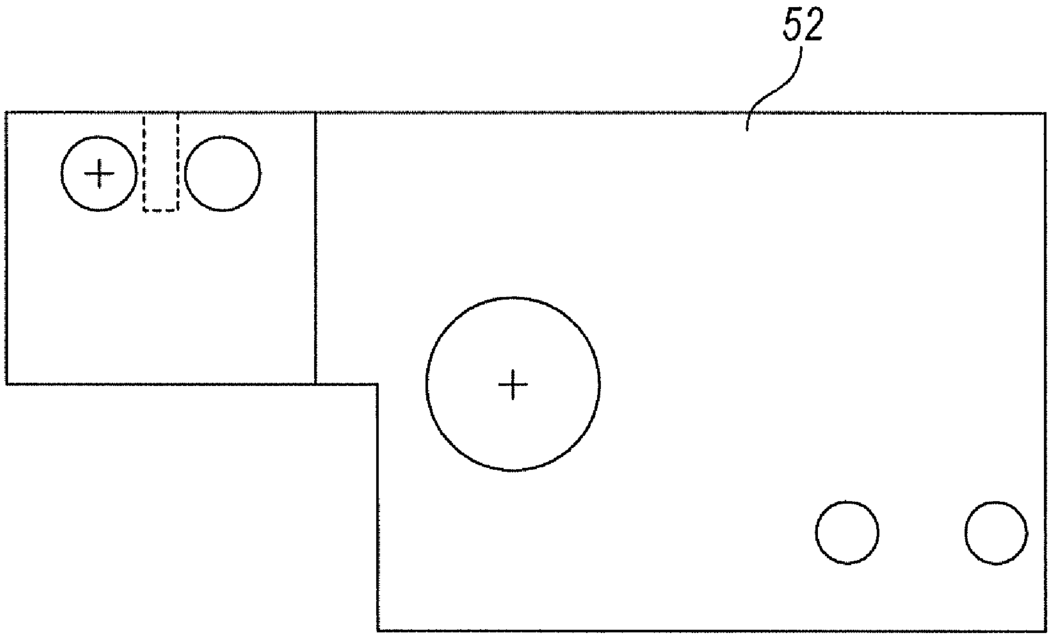
FIG. 14 is a side elevational view of the first bracket of FIG. 13.
Figure 15:
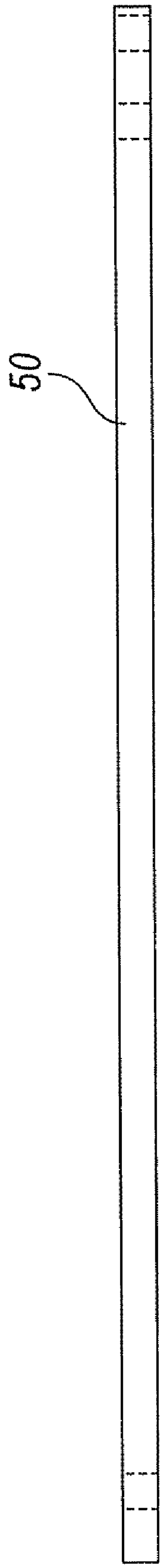
FIG. 15 is a top view of an exemplary embodiment of a second bracket.
Figure 16:
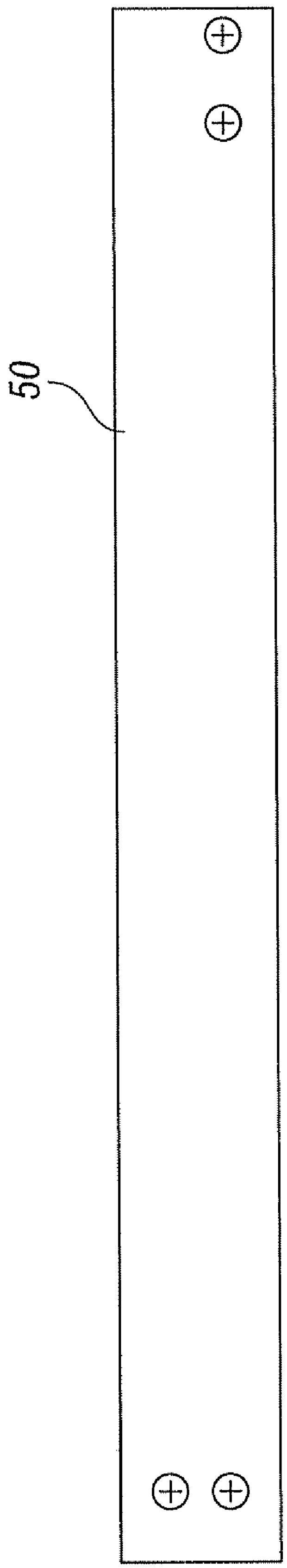
FIG. 16 is a side elevational view of the second bracket of FIG. 14.

In one embodiment, nozzle head 200 is a generally sized to be received within gap 66 and has an opening 202 that is in fluid communication with a back bedding glazing compound channel 204 that extends through nozzle head 200. An exemplary embodiment of nozzle head 200 is depicted in FIGS. 10-12. In the embodiment shown, nozzle head 200 has a generally rectangular shape defined by substantially planar major surfaces 206. However, the shape of nozzle head 200 is not limited to the shape shown in FIGS. 10-12. Indeed, other exemplary shapes, such as trapezoid, triangular, and semi-circular are also contemplated. In one embodiment, a chamfered edge 207 may be provided allow for ease of positioning of nozzle head 200 into gap 66.

Back bedding glazing compound channel 204 is formed through a top surface 208 of nozzle head 200 and extends through nozzle head 200 to opening 202. In one exemplary embodiment, opening 202 is configured to extend through a side surface 210 of nozzle head 200, adjacent to a bottom surface 212 of nozzle head 200. As will be explained in further detail below, this arrangement of opening 202 provides a controlled dispensing of back bedding glazing compound.

Figure 7:
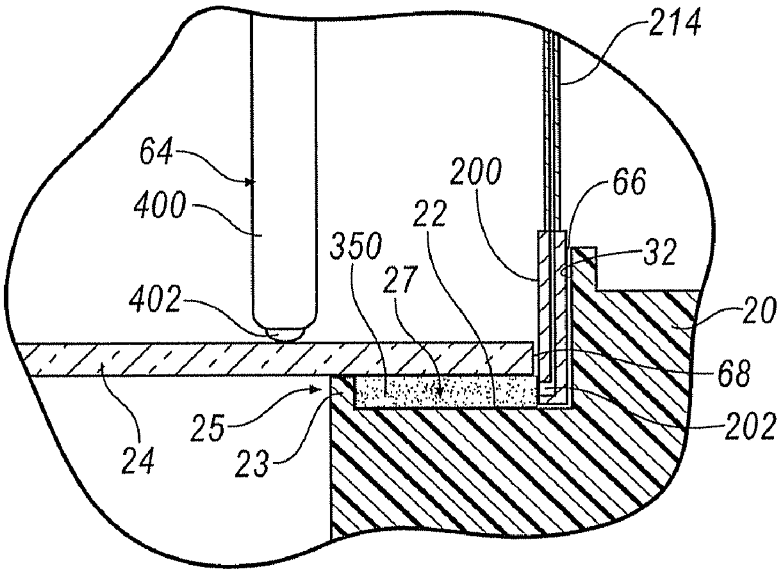
FIG. 7 is a partial cross-sectional view of the back bedding glazing compound applicator during the back bedding glazing compound application step in a method of assembling a viewing area to a sash.

As seen in FIGS. 2 and 7, in one embodiment of applicator nozzle assembly 48, a tube member 214 is fixedly attached to nozzle head 200, around back bedding glazing compound channel 204, tube member 214 is fixedly attached to a connecting member 216 which secures to an applicator holder 218.

Figure 8:
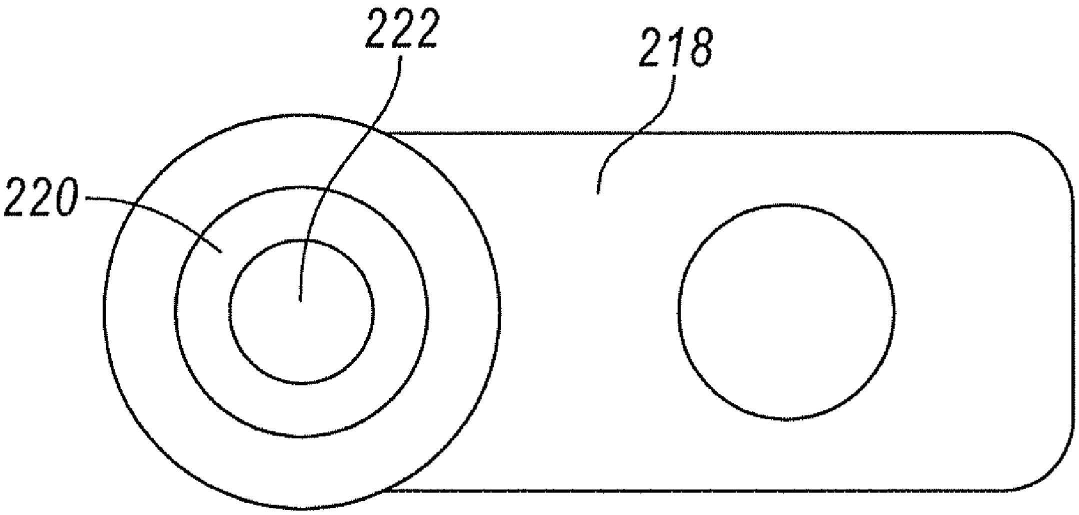
FIG. 8 is top plan view of an exemplary embodiment of an applicator holder.
Figure 9:
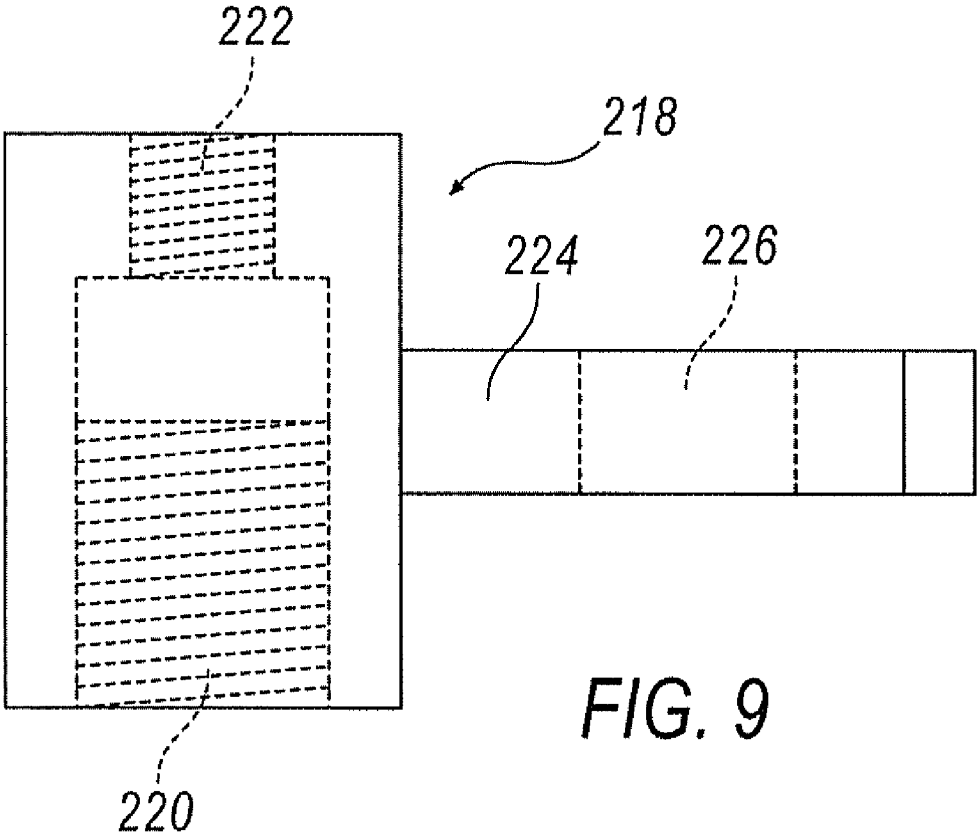
FIG. 9 is a side elevational view of the applicator holder of FIG. 8.

An embodiment of applicator holder 218 is shown in FIGS. 8 and 9. Applicator holder 218 includes a connection channel 220 that is in communication with a mixer channel 222. Connecting member 216 is received within connection channel 220. In one embodiment, a distal end of static mixer 44 (which is positioned within sleeve 46) is fixedly secured in mixer channel 222. The connection between static mixer 44 and mixer channel 222 may be a snap-fit connection. Other suitable connection members may also be used. When both static mixer 44 and connecting member 216 are engaged within applicator holder 218, opening 202 in nozzle head 200 is in fluid communication with static mixer 44.

Figure 19:
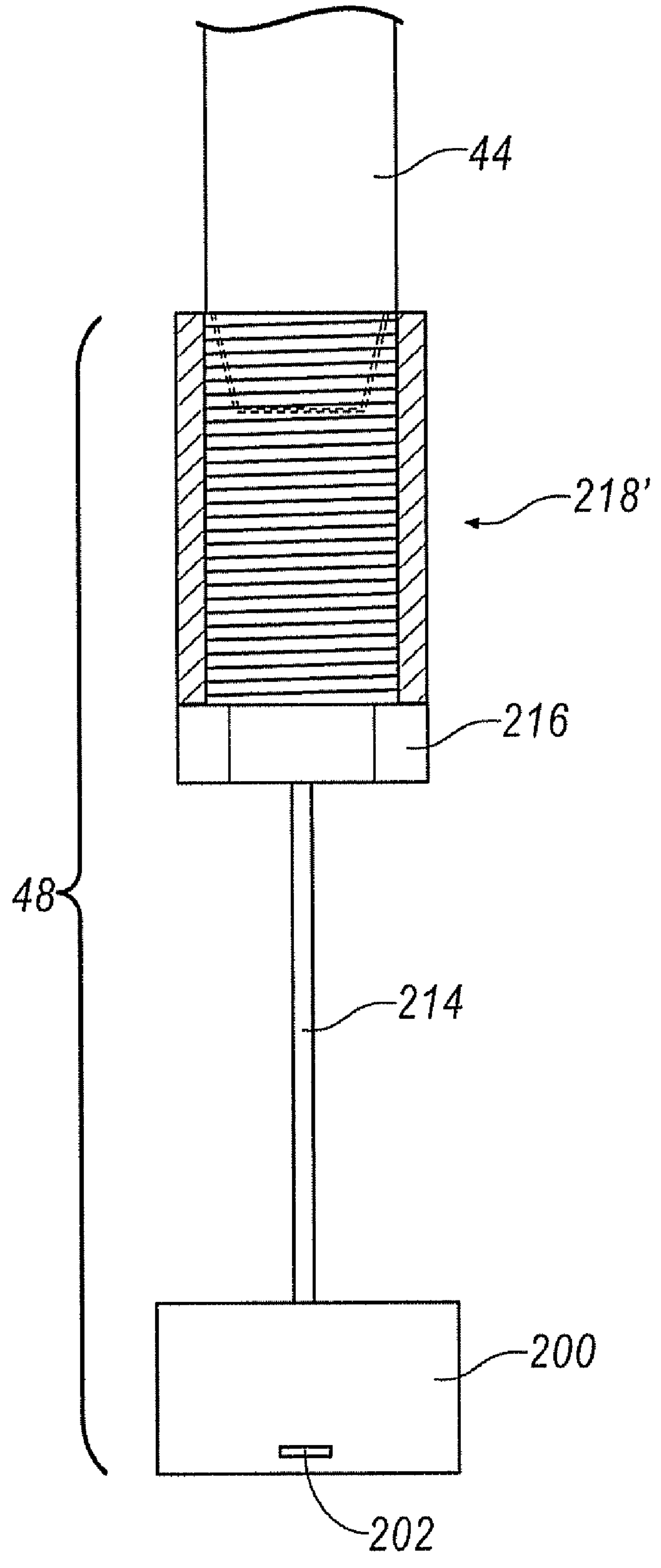
FIG. 19 is a partial cross-sectional view of an exemplary embodiment of a back bedding glazing compound applicator assembly.

Applicator holder 218 shown in FIGS. 2 and 9 further include an optional integral stabilizer mount 224. Stabilizer mount 224 includes a mounting channel 226 that receives a portion of stabilizer assembly 64. An alternative embodiment of applicator holder 218' is shown in FIG. 19. As may be seen, applicator holder 218' does not include stabilizer mount 224.

Figure 20:
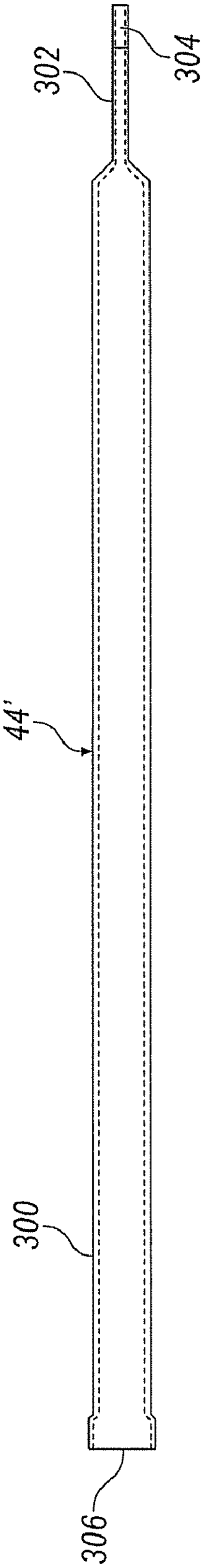
FIG. 20 is a side elevational view of an exemplary embodiment of a static mixer housing.
Figure 22:
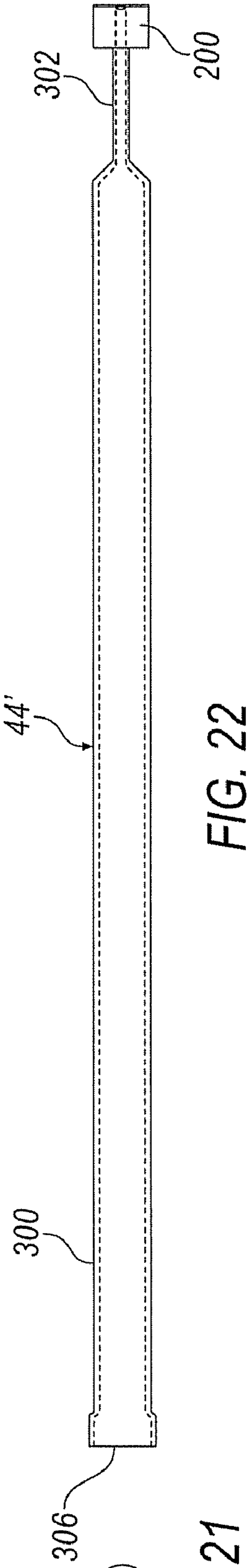
FIG. 22 is a side elevational view of the static mixer housing secured to the back bedding glazing compound applicator nozzle of FIG. 10-12.
Figure 21:
FIG. 21 is a top plan view of a static mixer housing of FIG. 20 secured to a back bedding glazing compound applicator nozzle.
Figure 23:
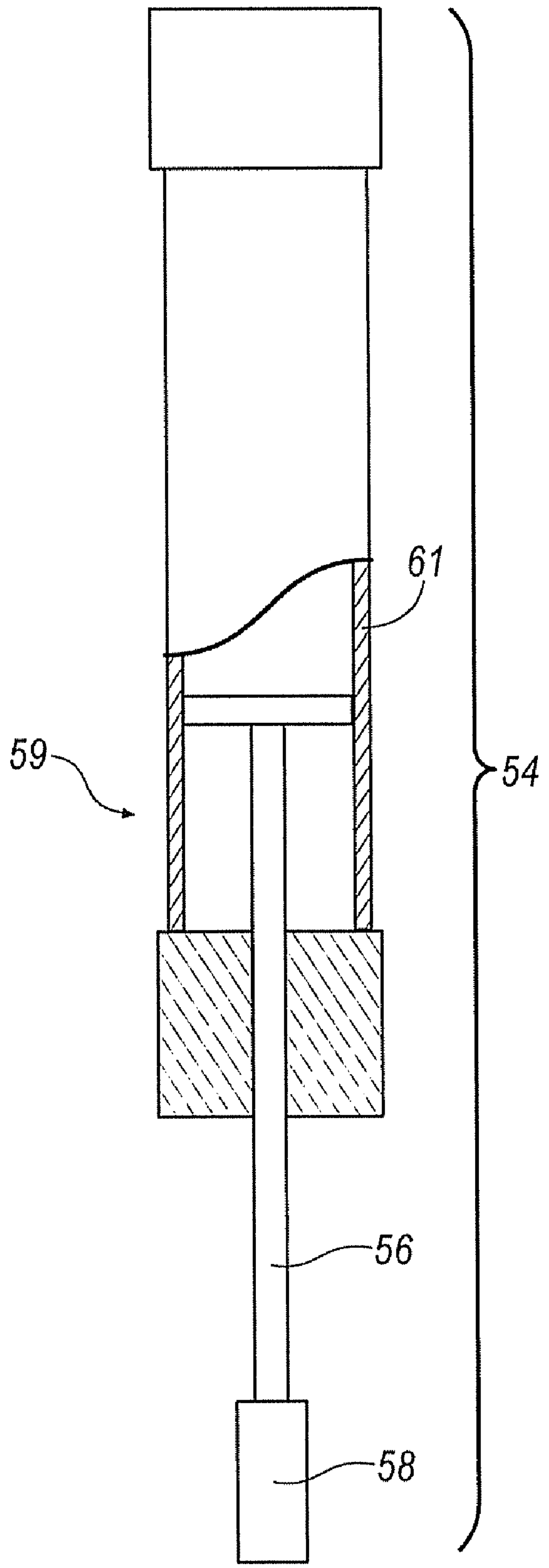
FIG. 23 is a partial cross-sectional view of a positioner assembly.

While FIGS. 1-5 illustrate nozzle assembly 48 mounted in applicator holder 218 and nozzle head 200 being spaced apart from static mixer 44, in yet another embodiment, nozzle head 200 may be directly fixed to a distal end of static mixer 44'. Referring to FIGS. 20-22, static mixer 44' includes a tubular body 300 that tapers into a narrow channel 302 at a distal end 304 thereof. A proximal end 306 is open to receive back bedding glazing compound during operation. Omitted for clarity from static mixer 44 is a series of spiral members that serve to mix the back bedding glazing compound materials, if required. As shown in FIG. 22, distal end 304 is inserted into back bedding glazing compound channel 204 formed in nozzle head 200 and fixedly secured thereto by any suitable means.

Referring back to FIGS. 5 and 7, at step 112, applicator nozzle head 200 is lowered into the dispensing position, nozzle head 200 is positioned within gap 66 created between outside edge 68 of glass layer 24 and interior surface 32 of sash 20. As may be seen best in FIG. 7, glazing leg 22 includes a lip 23 that is formed along an edge 25 that extends inwardly toward sash opening 26. Lip 23 cooperates with glass layer 24 to create a back bedding glazing compound groove 27 that is in fluid communication with gap 66. When applicator nozzle head 20 is positioned in gap 22, opening 202 in nozzle head 20 is oriented so as to be directed toward back bedding glazing compound groove 27. Then in step 114, back bedding glazing compound 350 is pumped through nozzle assembly 48 and into back bedding glazing compound groove 27 with sufficient pressure so as to substantially fill back bedding glazing compound groove 27. The area that defines back bedding glazing compound groove 27 is also known as the "bite."

Once lowered into gap 66 and back bedding glazing compound 350 is being dispensed, nozzle assembly 48 travels around outside edge 68 of glass layer 24 so as to extend around the perimeter of glass layer 24. To accommodate the corners formed in sash 20, nozzle assembly 48 is lifted and rotated as each reaches each corner. This action is referred to as "indexing."

The travel speed of nozzle assembly 48, fluid pressure and volumetric flow rate of back bedding glazing compound 300 are selected depending on the size of sash 20 and the viscosity of back bedding glazing compound 350. In one embodiment, travel speed, fluid pressure and volumetric flow rate are controlled by a central process unit.

In one embodiment, in connection with step 112, stabilizer assembly 64 is also provided that is operably connected to nozzle assembly 48. As such, as nozzle assembly 48 is moved from the stored position to the dispensing position, stabilizer assembly 64 is also moved into a contacting position (shown in FIG. 7), as will be explained in further detail below.

Figure 17:
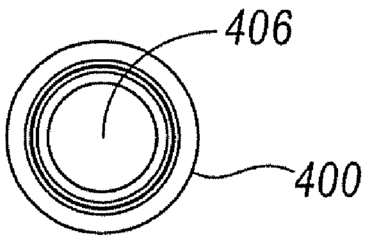
FIG. 17 is a top plan view of an exemplary embodiment of a stabilizer housing.
Figure 18:
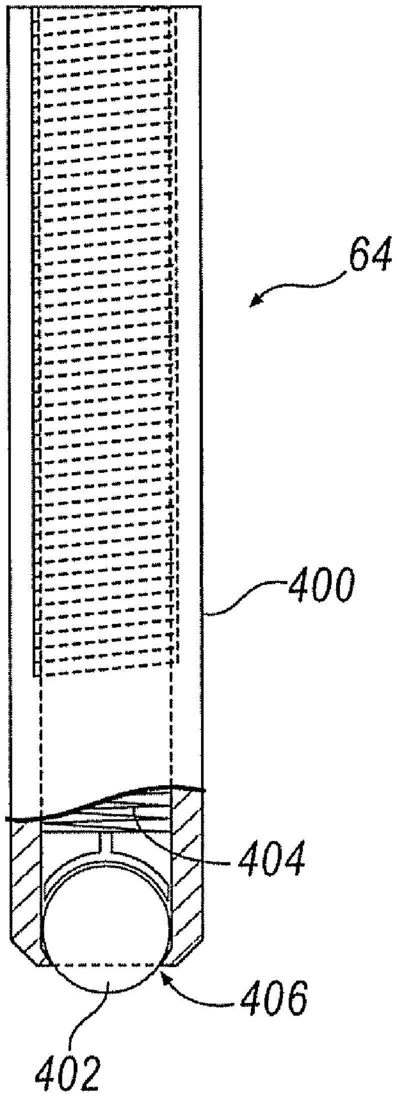
FIG. 18 is a side elevational view of the stabilizer housing of the stabilizer housing of FIG. 17 and a partial cross-sectional view of the interior of the stabilizer.

An embodiment of stabilizer assembly 64 is shown in FIGS. 17-18. Stabilizer assembly 64 includes stabilizer housing 400, a roller or caster ball 402, and an actuation member 404. Stabilizer housing 400 is generally hollow and retains roller ball 402 and actuation member 404 therein. In operation, actuation member 404 biases roller ball 402 partially through an opening 406 formed in stabilizer housing 400. In one embodiment, actuation member 404 is a spring that may be activated by a plunger (no shown), when in an operation position (shown in FIG. 7).

Referring back to FIG. 7, when stabilizer assembly 64 is moved into the operation position, roller ball 402 extends outwardly from opening 406 and applies force to a top surface of glass layer 24 (when placed on glazing table 28). In one particular exemplary embodiment, stabilizer assembly 64 is positioned to be adjacent nozzle assembly 48. Moreover, actuating member 404 acts against roller ball 402 so as to apply a force normal to glass layer 24 adjacent the periphery of glass layer 24, as back bedding glazing compound 350 is being dispensed by nozzle assembly 48. The applied force by stabilizer assembly 64 prevents back bedding glazing compound 350 from pushing glass layer 24 upwardly during dispensing. Stabilizer assembly 64 is configured to travel at the same speed as nozzle assembly to apply a continuous force while back bedding glazing compound 350 is being applied. In one particular embodiment, stabilizer assembly 64 is configured to apply about 2-20 lbs of force on glass layer 24.

In one exemplary embodiment, to insure that stabilizer assembly 64 travels with nozzle assembly 48, stabilizer housing 400 may be fixedly mounted to applicator holder 218. Thus, as applicator nozzle assembly 48 travels around glazing leg 22 that borders sash opening 26, stabilizer assembly 64 will move with nozzle assembly 48.

In another alternative embodiment, instead of providing stabilizer assembly 64, mechanically actuated vacuum cups may be applied to the underside of glass layer 24 to retain glass in place while the back bedding glazing compound dispensing operations proceeds.

After back bedding glazing compound 350 has been applied to glazing leg along the perimeter of sash opening 26, at step 116, nozzle assembly 48 and (if included) stabilizer assembly 64 are retracted to the stored position.

At step 118, the glazed sash is then moved to a transfer conveyor. The transfer conveyor may be configured of sufficient length and operated at a sufficient speed that the back bedding glazing compound is cured prior to the next manufacturing operation.

Because back bedding glazing compound 350 is not applied until after glass layer 24 is properly centered within sash opening 26, and because back bedding glazing compound 350 is being applied substantially directly and simultaneously to glass layer 24 and glazing leg 22, a suitable back bedding glazing compound 350 may be used that significantly reduces the cure time required by prior art glazing methods. More specifically, a back bedding glazing compound 350 that has a cure time of five minutes or less may be used. An example of such back bedding glazing compound is sold under the trade name Sikasil© WT-490 manufactured by the owner of the present application. Due to a shorter cure time, the cumbersome process of continuously loading glazed sashes onto curing pallets may be eliminated at considerable savings.

While the disclosure has been described in connection with a single glass layer 24, it is understood that the process of glazing using an insulating glass unit is also within the scope of the disclosure.

The above description is intended to be illustrative and not restrictive. Many alternative approaches or applications other than the examples provided would be apparent to those of skill in the art upon reading the above description. The scope of the invention should be determined, not with reference to the above description, but should instead be determined with reference to the appended claims, along with the full scope of equivalents to which such claims are entitled. It is anticipated and intended that future developments will occur in the arts discussed herein, and that the disclosed systems and methods will be incorporated into such future examples. In sum, it should be understood that the invention is capable of modification and variation and is limited only by the following claims.

The present embodiments have been particularly shown and described, which are merely illustrative of the best modes. It should be understood by those skilled in the art that various alternatives to the embodiments described herein may be employed in practicing the claims without departing from the spirit and scope as defined in the following claims. It is intended that the following claims define the scope of the invention and that the method and apparatus within the scope of these claims and their equivalents be covered thereby. This description should be understood to include all novel and non-obvious combinations of elements described herein, and claims may be presented in this or a later application to any novel and non-obvious combination of these elements. Moreover, the foregoing embodiments are illustrative, and no single feature or element is essential to all possible combinations that may be claimed in this or a later application.

All terms used in the claims are intended to be given their broadest reasonable constructions and their ordinary meanings as understood by those skilled in the art unless an explicit indication to the contrary is made herein. In particular, use of the singular articles such as "a," "the," "said," etc. should be read to recite one or more of the indicated elements unless a claim recites an explicit limitation to the contrary.

What is claimed:

1. A method of glazing a sash, comprising:

placing a sash on a glazing table, wherein the sash defines an opening therein, a glazing leg extending into the opening in the sash;

actuating at least two positioner assemblies, each positioner assembly having a position member defining a distal end, and wherein each position member is selectively slidable between a stored position and an extended position; wherein the positioner assemblies are actuated such that each position member is moved into the extended position such that the distal end of the position member contacts the glazing leg of the sash;

inserting a viewing element into the sash opening and abutting the viewing element against portions of the position members so as to create a gap between an interior surface of the sash and an outer edge of the viewing element;

retracting the position members;

actuating a back bedding glazing compound applicator assembly to move from a stored position to a dispensing position, wherein the back bedding glazing compound applicator includes a nozzle head that is configured to fit within the gap between the interior surface of the sash and the outer edge of the viewing element when in the dispensing position;

fitting the nozzle head into the gap;

dispensing back bedding glazing compound between the glazing leg and the viewing element; and retracting the back bedding glazing compound applicator assembly to the stored position.

2. The method of claim 1, further comprising fixing the sash onto the glazing table such that the sash is prevented from moving during the glazing method.

3. The method of claim 1, wherein a portion of the position members contact the interior surface of the sash when the distal end contacts the glazing leg.

4. The method of claim 1, wherein the position members each further comprise a tip element secured to the distal end thereof such that when the position members are moved to the extended position, the tip element contacts the glazing leg.

5. The method of claim 4, wherein the tip element of each position member contacts the interior surface of the sash when the tip member contacts the glazing leg.

6. The method of claim 1, wherein the viewing element is a layer of glass.

7. The method of claim 1, wherein the viewing element is an insulating glass unit assembly.

8. The method of claim 1, wherein the viewing element is pushed against each of the distal ends after being placed within the sash opening.

9. The method of claim 1 further comprising actuating a depth probe between a stored position and an extended position, wherein actuating the depth probe extends a distal end of the depth probe through the gap defined between the interior surface of the sash and an outer edge of the viewing element to detect the distance that the nozzle head must be actuated to place the nozzle head in the dispensing position; and wherein depth probe is returned to the stored position after the distance is detected.

10. The method of claim 1, wherein the glazing leg further comprises an upwardly extending lip disposed on an outer edge of the glazing leg, the lip cooperating with a bottom surface of the viewing element and the glazing leg to define a glazing groove that is in fluid communication with the gap; wherein the back bedding glazing compound is dispensed in the glazing groove.

11. The method of claim 10, wherein the nozzle head is configured with an opening formed on a side surface thereof, and wherein the opening is oriented towards the glazing groove when the nozzle head is in the dispensing position.

12. The method of claim 1, wherein the back bedding glazing compound applicator is manually moved from the stored position to the dispensing position.

13. The method of claim 12, further comprising providing a position indicator, wherein the position indicator indicates the position of the nozzle head prior to being placed in the dispensing position.

14. The method of claim 1, further comprising actuating a stabilizer assembly from a stored position to a dispensing position, wherein the stabilizer assembly is configured to impart a predetermined force on the viewing element while the back bedding glazing compound is being dispensed between the glazing leg and the viewing element.

15. The method of claim 14, wherein the stabilizer assembly comprises a biased roller ball that engages a top surface of the viewing element to impart the force on the viewing element.

16. The method of claim 15, wherein the stabilizer assembly and the back bedding glazing compound applicator assembly are integrally fixed with respect to one another such that movement of the back bedding glazing compound applicator assembly causes the stabilizer assembly to move.

17. The method of claim 1, wherein the back bedding glazing compound is dispensed along a common plane until it reaches an intersecting plane, whereby the nozzle assembly is retracted and the back bedding glazing compound applicator assembly is re-oriented with nozzle head being returned to the dispensing position in the intersecting plane.

18. The method of claim 1, wherein after the back bedding glazing compound applicator is retracted into the stored position, the sash is moved to a transfer conveyor.

19. The method of claim 1, wherein the back bedding glazing compound has a cure time of about 5 minutes.

20. A method of glazing a sash, comprising:

placing a sash on a glazing table, wherein the sash defines an opening therein, a glazing leg extending into the opening in the sash;

actuating at least two positioner assemblies, each positioner assembly having a position member defining a distal end, and wherein each position member is selectively slidable between a stored position and an extended position; wherein the positioner assemblies are actuated such that each position member is moved into the extended position such that the distal end of the position member contacts the glazing leg of the sash;

inserting a viewing element into the sash opening and abutting the viewing element against portions of the position members so as to create a gap between an interior surface of the sash and an outer edge of the viewing element;

retracting the position members;

simultaneously actuating a back bedding glazing compound applicator assembly and a stabilizing assembly to move from a stored position to a dispensing position, wherein the back bedding glazing compound applicator includes a nozzle head that is configured to fit within the gap between the interior surface of the sash and the outer edge of the viewing element when in the dispensing position and the stabilizing assembly is configured with a roller ball element that is configured to impart a predetermined force on a top surface of the viewing element while the back bedding glazing compound is being dispensed between the glazing leg and the viewing element so as to prevent the viewing element from pushing the viewing element upwardly in response to the back bedding glazing compound being dispensed;

fitting the nozzle head into the gap;

dispensing back bedding glazing compound between the glazing leg and the viewing element while the stabilizer assembly imparts the predetermined force on the top surface of the viewing element and while the back bedding glazing compound applicator assembly and stabilizer assembly moves along the perimeter of the sash opening defined by the glazing leg; and retracting the back bedding glazing compound applicator assembly and the stabilizer assembly into the stored position after back bedding glazing compound has been applied along the perimeter.

* * * * *